United States Patent [19]

Merrill et al.

[11] Patent Number: 5,095,267
[45] Date of Patent: Mar. 10, 1992

[54] METHOD OF SCREENING A.C. PERFORMANCE CHARACTERISTICS DURING D.C. PARAMETRIC TEST OPERATION

[75] Inventors: Richard B. Merrill, Daly City; Edson D. Gomersall, Saratoga; Enayet O. Issaq, San Jose, all of Calif.

[73] Assignee: National Semiconductor Corporation, Santa Clara, Calif.

[21] Appl. No.: 706,788

[22] Filed: May 29, 1991

Related U.S. Application Data

[62] Division of Ser. No. 495,780, Mar. 19, 1990, Pat. No. 5,039,602.

[51] Int. Cl.$^5$ .................. G01R 31/00; G01R 31/02
[52] U.S. Cl. ..................... 324/158 R; 324/158 D; 324/158 T; 371/22.5; 437/8
[58] Field of Search .......... 324/158 R, 158 D, 158 T, 324/512, 520; 437/8, 7; 371/22.5, 0.6

[56] References Cited

U.S. PATENT DOCUMENTS

| | | | |
|---|---|---|---|
| 3,781,670 | 12/1973 | McMahon, Jr. | 324/57 |
| 3,922,707 | 11/1975 | Freed et al. | 357/48 |
| 4,045,736 | 8/1977 | Carpenter et al. | 324/158 |
| 4,403,287 | 9/1983 | Blahut et al. | 371/22.6 |
| 4,606,025 | 8/1986 | Peters et al. | 371/20 |
| 4,801,875 | 1/1989 | Ige | 324/158 |
| 4,808,915 | 2/1989 | Russell | 371/22.6 |
| 4,904,883 | 2/1990 | Dino et al. | 371/22.5 |
| 4,918,385 | 4/1990 | Shreeve | 371/22.6 |
| 4,945,540 | 7/1990 | Kaneko | 371/22.5 |
| 5,014,226 | 5/1991 | Horstmann et al. | 371/22.6 |

FOREIGN PATENT DOCUMENTS

| | | |
|---|---|---|
| 0065542 | 4/1985 | Japan . |
| 0119748 | 6/1985 | Japan . |
| 0030044 | 2/1986 | Japan . |

*Primary Examiner*—Kenneth A. Wieder
*Assistant Examiner*—William J. Burns
*Attorney, Agent, or Firm*—Limbach & Limbach

[57] ABSTRACT

A method of characterizing A.C. performance of an integrated circuit based upon D.C. measurements utilizing a process monitor circuit. The process monitor circuit provides a D.C. output having a magnitude which varies with the frequency of an oscillator section of the monitor circuit. The frequency is a function of both A.C. and D.C. performance, therefore the process monitor output signal is indicative of such performance. Since D.C. measurements may be made while the integrated circuits are in wafer form utilizing a conventional wafer prober and parametric tester, it is possible to detect A.C. performance problems very early in the manufacturing process.

4 Claims, 8 Drawing Sheets

FIG. 3  RING OSCILLATOR

METHOD OF SCREENING A.C. PERFORMANCE CHARACTERISTICS DURING D.C. PARAMETRIC TEST OPERATION

This is a divisional of application Ser. No. 07/495,780, filed Mar. 19, 1990, now U.S. Pat. No. 5,039,602.

BACKGROUND OF THE INVENTION

1. Field of the Invention

The present invention relates generally to a method of testing semiconductor integrated circuits and more particularly to a method of characterizing A.C. performance of an integrated circuit during D.C. parametric testing.

2. Description of Related Art

FIG. 1 is a simplified block diagram representing typical conventional methods of manufacturing complex integrated circuits. As indicated by element 10, the integrated circuits are first fabricated. At this stage of the process, the circuits are in wafer form, with a single wafer containing hundreds or even thousands of individual integrated circuits.

Since processes for fabricating integrated circuits are complex and since such processes may vary over time, it is preferable to provide some means for monitoring the fabrication process at an early stage of the manufacture. Typically, each wafer includes one or more process monitor die, each of which contains one or more test patterns. These test patterns are designed to detect changes in the fabrication process.

As represented by block 12, electrical tests are carried out utilizing the process monitor die. These tests are typically carried out using a wafer prober in conjunction with a parametric tester. The wafer prober, which is automated, steps from one process monitor die to another and provides electrical connections to the test pattern circuits. In addition, the prober provides connections for powering the circuits, for supplying input test signals to the circuits and connections for the output signals to be measured. The parametric tester provides the power and input signals and measures the output signals.

At this stage of the manufacturing process, it is practical only to measure the D.C. characteristics of the integrated circuits. These characteristics include threshold voltages, saturation voltages and the like. One reason for this limitation is because a wafer prober typically has poor frequency performance (narrow bandwidth) and is not capable of efficiently coupling higher frequency A.C. signals to the circuits. It is generally not practical to screen for A.C. characteristics until the wafer has been broken into individual die and the die have been mounted in packages.

In some instances, limited functional testing is carried out on the integrated products. The purpose of such functional testing, which may require the use of relatively low frequency input signals, is to determine whether the circuit will function even at low speed. Although such functional testing may provide limited information regarding A.C. performance, the testing cannot usually be carried out using a D.C. parametric tester exclusively. In addition, the A.C. performance which is measured in this manner is dependent upon the type and nature of the integrated circuit product.

Once the D.C. characteristics of the process monitor die have been measured, the wafer is scribed and broken. The die are sorted, as shown by block 14, in accordance with the results of the D.C. and functionality testing. At this stage, many of the die are discarded. The die that pass the D.C. and functionality screening are than assembled as indicated by element 16. This involves mounting the die in packages and connecting the die to the package leads using bonding wire or the like.

Once the circuits are assembled, the final tests are carried out as shown by block 18. The final tests include A.C. testing of the packaged parts. This A.C. testing typically includes functional tests of the integrated circuit devices and therefore measures both A.C. and D.C. performance. Those integrated circuit devices which pass the final tests are then placed in inventory or stock for sale, as indicated by block 20.

The previously described prior art manufacturing process, where A.C. testing occurs only after assembly, possesses several serious shortcomings. By way of example, it is very costly to sort parts (block 14) and to assemble parts (block 16) which have passed D.C. screening (block 12), but which will eventually fail functional A.C. testing (block 18).

A further shortcoming arises when circuits are fabricated in one location and are transported to another location for assembly. Typically, the assembled parts are returned to the fabrication facility for final testing. In the event there are problems with the fabrication process which affect only A.C. performance and not D.C. performance, the process problems will not be discovered for quite some time, commonly on the order of several weeks. Meanwhile, large numbers of defective parts will have been fabricated, sorted and assembled.

A still further shortcoming of the above-described manufacturing process arises when the process is transferred from one location to another. For example, it is common for a company to design a new integrated circuit device and to develop a process for manufacturing the circuit. Once the circuit is designed and the process optimized, another facility, such as a foundry, is utilized to perform the initial manufacturing steps. These steps include fabrication (block 10) and D.C. screening (block 12). The devices are then typically shipped to the main plant for sorting (block 14) and for assembly (block 16) and final test (block 18).

The process at the main plant must be successfully transferred to the foundry. A process that is developed on a prototype line for transfer to a foundry is typically specified by a set of measurable electrical parameters, such as threshold voltage and the like. The purpose of such specifications is to guarantee a known range of circuit characteristics, including both D.C. and A.C. performance.

When a process is transferred to a foundry, it is possible that parameters which cannot be measured electrically will vary in a direction which degrades A.C. performance. Further, parameters which can be measured electrically are located within the associated specification range differently than in the original process, frequently in a direction which degrades performance. The result is a transferred process which meets the original specification, but the A.C. performance does not meet the expectations established by samples from the prototype lines.

The present invention overcomes the above-noted shortcomings of prior art integrated circuit manufacturing processes. In accordance with the present invention, parameters relating to A.C. performance characteristics can be readily measured at the first electrical test stage (block 12) while the devices are still in wafer form utilizing a unique process monitor circuit. Since the process monitor circuit is separate from the principal integrated circuit devices on the wafer and since the process monitor can be standardized, A.C. performance characteristics can be reliably measured, independent of the type of principal integrated circuit device. Furthermore, the measurements made utilizing the process monitor circuit can be carried out utilizing conventional parametric testing equipment capable of making D.C. measurements only. In addition, the parameters relating to A.C. performance can be made with a wafer prober despite the bandwidth limitations of the wafer probe head.

The present invention permits devices which would not meed A.C. performance specifications normally measured at final test (block 18) to be eliminated prior to the sorting and assembly thereby resulting in substantial savings. Further, the time required to uncover problems in the fabrication process which adversely affect A.C. performance is greatly reduced. In addition, a process can be readily transferred to a foundry with a set of specifications which can be measured at the foundry using conventional D.C. parametric testing equipment and which can predict both A.C. and D.C. performance. These and other advantages of the present invention will become apparent to those skilled in the art upon a reading of the following Detailed Description of The Preferred Embodiment together with the drawings.

SUMMARY OF THE INVENTION

A method of implementing a fabrication process for manufacturing integrated circuits is disclosed, along with a method of manufacturing integrated circuits, and a process monitoring circuit.

The method of implementing a process for manufacturing integrated circuits includes the initial step of developing specifications which characterize both A.C. and D.C. parameters associated with the process to be implemented. This step may, by way of example, be carried out at a facility where the process was developed.

The next step calls for the fabrication of a multiplicity of integrated circuit devices and at least one process monitor circuit in a wafer of semiconductor material. This step is typically carried out at the location where the process is to be implemented, such as a foundry. The process monitor circuit preferably includes test patterns for measuring both A.C. and D.C. parameters. The test patterns include A.C. circuit means for producing an output signal having an amplitude which varies with the A.C. parameters. Next, the A.C. and D.C. parameters are measured and compared with the specifications typically generated at the original facility where the process was developed. Preferably, the process is modified in the event the A.C. and D.C. parameters do not meet the specifications.

The disclosed method of manufacturing integrated circuits begins first with the fabrication of a multiplicity of integrated circuit devices together with at least one process monitor circuit means in a wafer of semiconductor material. The process monitor circuit means provides a monitor output signal indicative of the A.C. performance of the integrated circuit device.

The monitor output signal si then measured and compared with certain predetermined specifications. Those integrated circuit devices that don't meet the specifications are rejected. The wafer is then broken into individual die and those individual die which are not rejected are packaged. The packaged devices are then subjected to further functional electrical tests.

The disclosed wafer of semiconductor material includes a multiplicity of integrated circuit devices and at least one process monitor circuit means. The process monitor circuit means produces an output signal indicative of the performance of the integrated circuit devices. The process monitor circuit means includes oscillator means for producing an output signal having a frequency which varies with the performance of the integrated circuit devices. Also included are means for receiving the output of a current source and for receiving one terminal of an external reference capacitor. Preferably, the current source is located in a D.C. parametric tester and coupled to the process monitor circuit means by way of a wafer probe card. Also, the external reference capacitor is preferably mounted on the probe card and coupled to the process monitor circuit by way of the card.

The process circuit means further includes switching means which is responsive to the oscillator output signal for charging the capacitor with current from the current source for a charge period which is a function of the output signal of the oscillator. As a consequence, the process monitor output signal will be produced across the reference capacitor at the end of the charge period.

DETAILED DESCRIPTION OF THE PREFERRED EMBODIMENT

Figure 1:
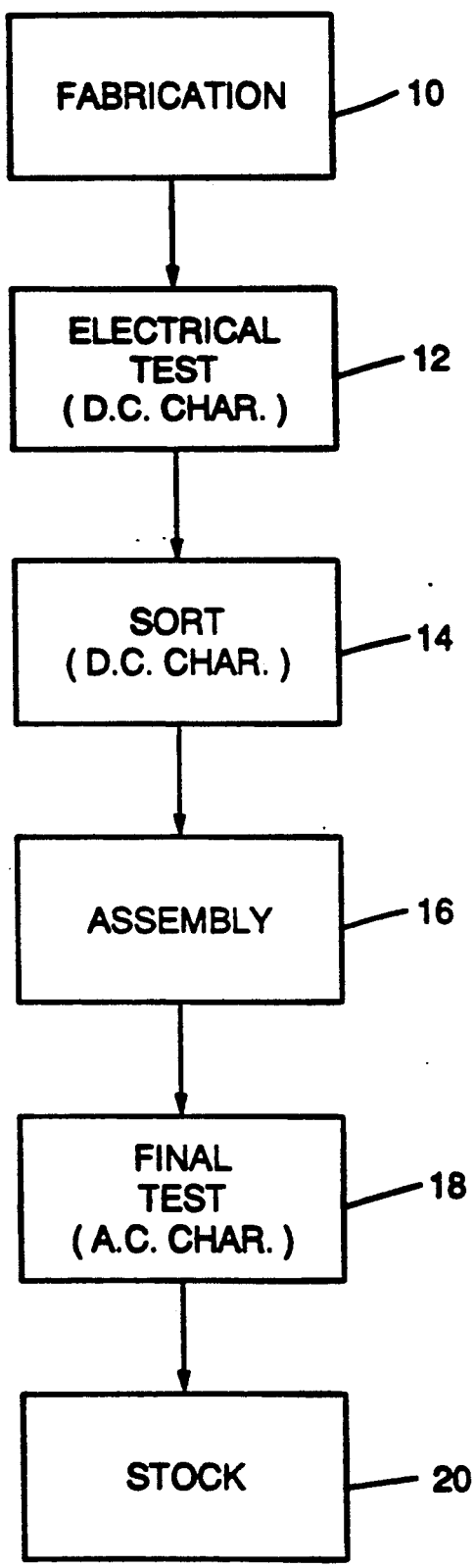
FIG. 1 is a simplified flow chart representing an exemplary prior art integrated circuit manufacturing process.
Figure 2:
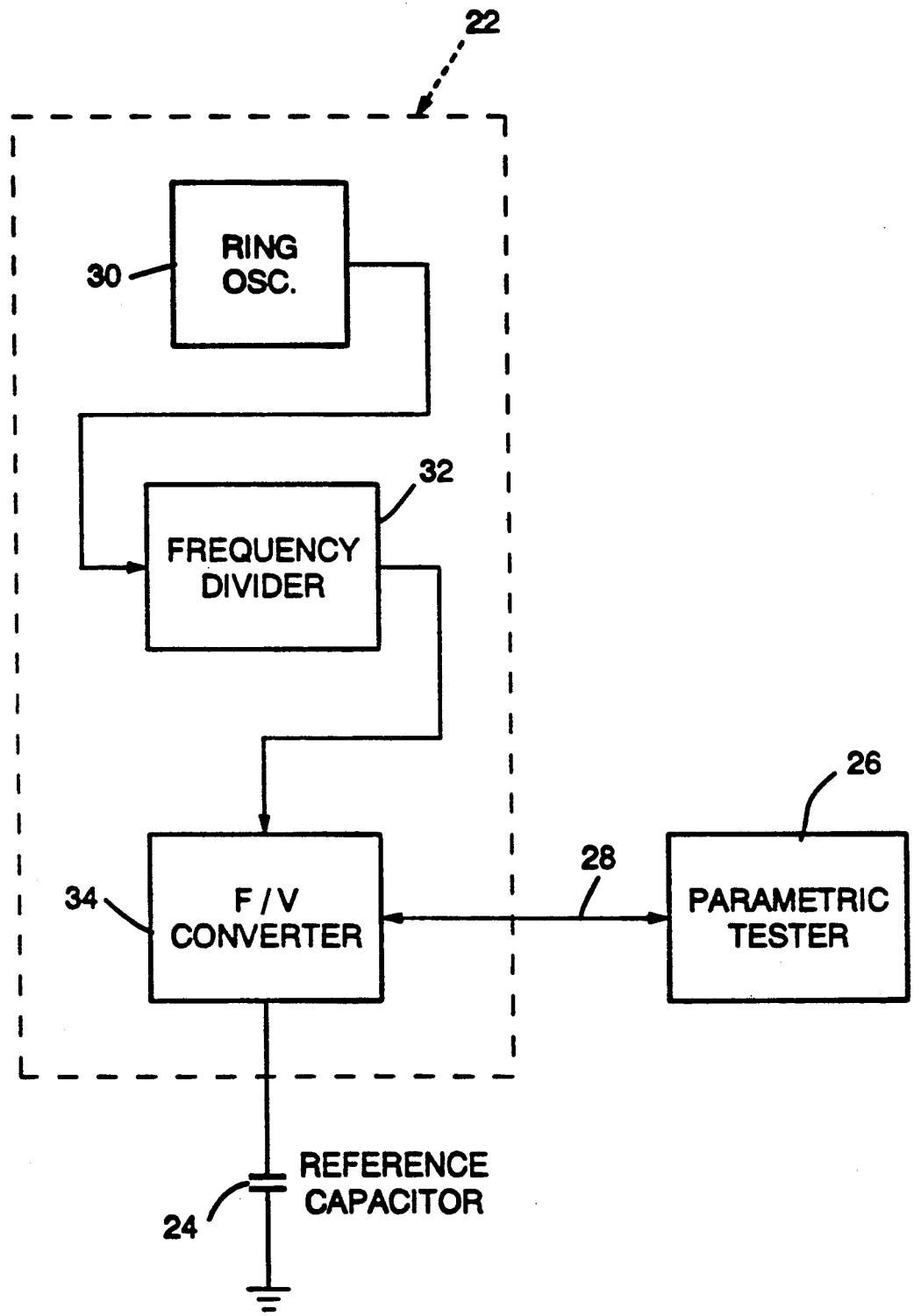
FIG. 2 is a simplified block diagram of an integrated process monitor circuit in accordance with the present invention, with the test circuit being connected to a parametric tester.
Figure 8:
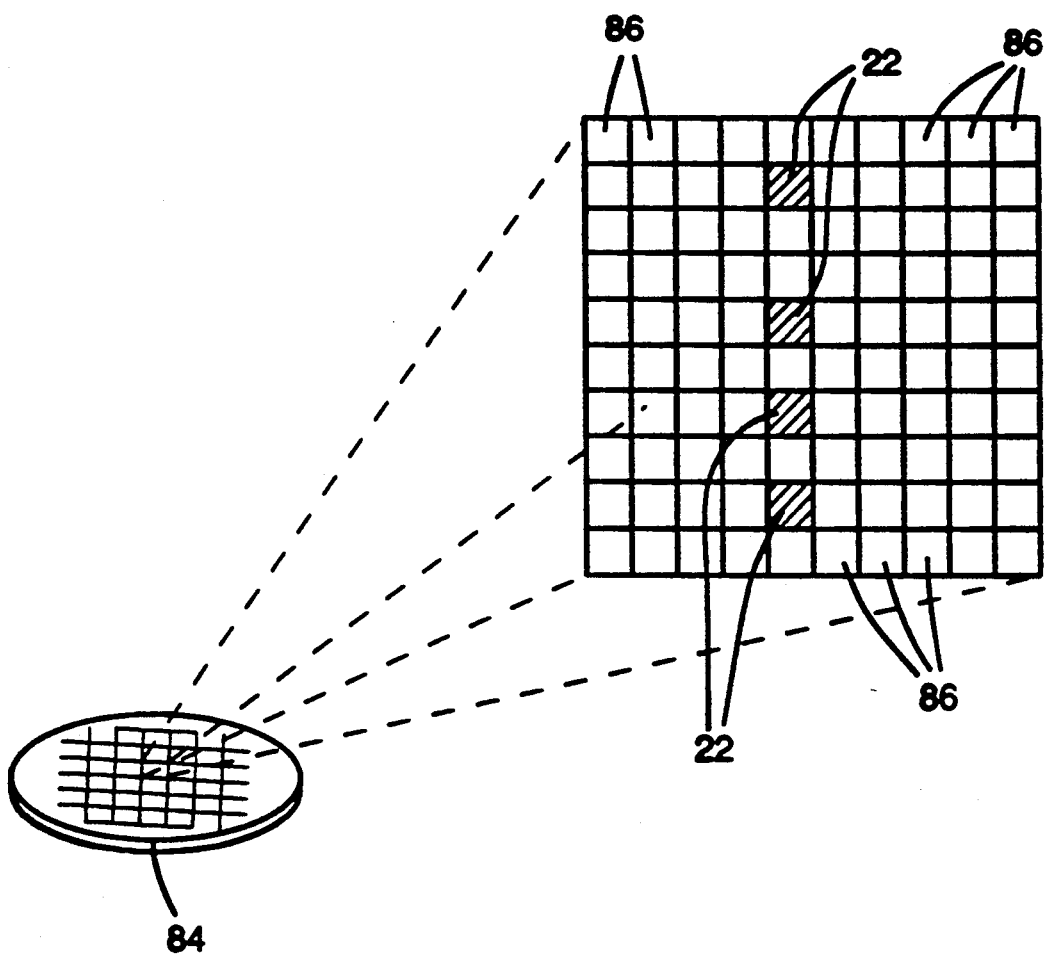
FIG. 8 is a perspective view of a semiconductor wafer and a blow up of a portion thereof showing the individual integrated circuit devices and the process monitor circuits.

Referring again to the drawings, FIG. 2 is a simplified block diagram of a process monitor circuit, generally designated by the numeral 22, to be used in connection with the subject invention. One or more process monitor circuits 22 is implemented in a semiconductor wafer manufactured in accordance with the process to be monitored. FIG. 8 shows an exemplary wafer 84 together with a blownup portion thereof. Typically, wafer 84 will be primarily comprised of the principal integrated circuit devices 86, in addition to at least one process monitor circuit 22. Preferably, wafer 84 will contain several process monitor circuits 22 uniformly distributed over the surface of the wafer. Such principal integrated circuit devices 86 would include essentially any integrated circuit device, including without limitation, operational amplifiers, voltage regulators, gate arrays, microprocessors and microcontrollers.

During the first electrical testing after fabrication, the process monitor circuit 22 is connected to a conventional D.C. parametric tester 26. The parametric tester 26 is electrically connected tot he monitor circuit by way of a wafer probe head represented schematically by line 28. An external reference capacitor 24 is also connected to the monitor circuit. Preferably, capacitor 24 is mounted on the wafer probe card (not shown) and is connected to the monitor circuit using extra probe pinouts.

A preferred embodiment of the process monitor circuit 22 includes a ring oscillator 30. As will be explained later in greater detail, the ring oscillator output frequency is a function of various D.C. and A.C. parameters associated with the oscillator. Many, if not all, of these parameters are process dependent. The nominal output frequency of ring oscillator 30 is typically on the order of 20 to 50 MHz.

Process monitor circuit 22 further includes a frequency divider 32. Divider 32 functions to divide the output frequency of oscillator 30 down to a relatively low frequency such as 1 to 10 Hz. The low frequency output of divider 32 is coupled to a frequency-to-voltage converter 34. Converter 34, in combination with an external reference capacitor 24 and parametric tester 26, produces a D.C. voltage, the magnitude of which is directly related to the frequency of the output oscillator 30. Thus, the voltage magnitude will vary depending upon D.C. and A.C. parameters associated with the oscillator 30.

Figure 3:
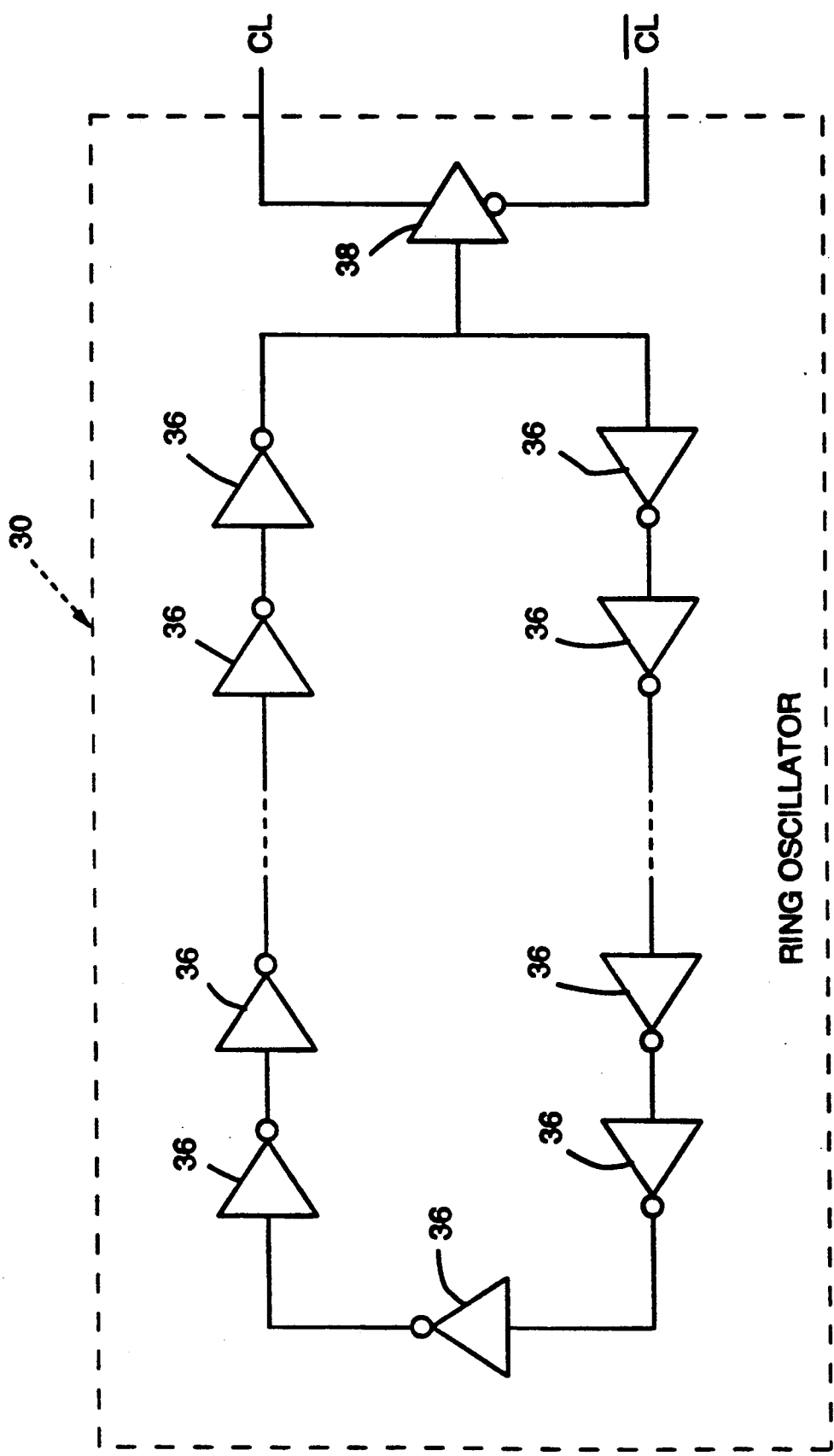
FIG. 3 is a detailed schematic digram of the ring oscillator portion of the FIG. 2 process monitor circuit.

FIG. 3 shows the details of the construction of ring oscillator 30. The oscillator is comprised of a plurality of inverter circuits 36 connected in a loop. An odd number of inverter circuits 36 must be used so that positive feedback is created. In the present embodiment, a total of fifty-one inverters or stages 36 are used. The output of the ring oscillator is buffered by a buffer circuit 38. Buffer circuit 38 produces a true clock output CL and an inverted clock output $\overline{CL}$.

Process monitor circuit 22 is implemented in the present embodiment utilizing a conventional 1.5 μm double metal CMOS process. A typical propagation delay Tpd through each inverter is 25×10−11 seconds. Since a single cycle of oscillator 30 output requires two transitions for each inverter, the total period of the oscillator output CL (or $\overline{CL}$) is as follows:

$$Tosc = Tpd \times 2 \times Nc \qquad (1)$$

Tosc is the oscillator 30 output period;
Tpd is the propagation delay of a single inverter 36; and
Nr is the number of inverters or stages 36 in the oscillator.

Assuming a nominal propagation delay Td of 25.38×10−11 seconds, and assuming there are fifty one (Nr) stages, equation (1) indicates that the nominal frequency of oscillator 30 (the inverse of Tosc) is 38.75 MHz. The propagation delay through the inverters 36 and hence the output frequency of the oscillator is a function of various D.C. and A.C. parameters, as previously noted. These parameters are, in turn, dependent to some degree on the process utilized in fabricating the ring counter 30.

Figure 4:
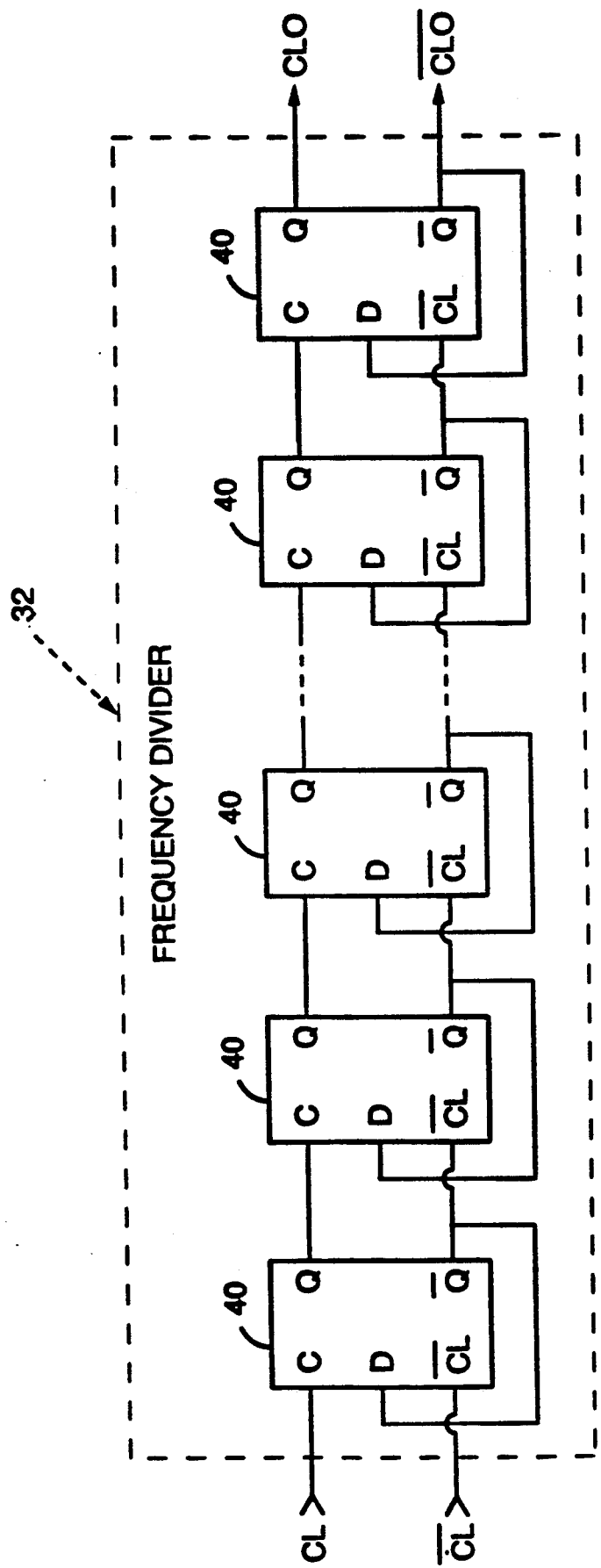
FIG. 4 is a detailed schematic diagram of the frequency divider portion of the FIG. 2 process monitor circuit.

The outputs CL and $\overline{CL}$ of oscillator 30 are connected to the input of frequency divider 32, the details of which are depicted in FIG. 4. The function of the divider is to reduce the frequency of ring oscillator to approximately 1 to 10 Hz. Divider 32 is comprised of a series of D type flip flops 40.

Each flip flop divider 40 of divider 32 has a clock input and an inverted clock input, with the first flip flop 40 of the divider receiving clock CL and inverted clock $\overline{CL}$ from the ring oscillator. The inverted output of $\overline{Q}$ of each flip flop 40 is connected back to the D input of the flip flop so that the flip flop outputs will toggle or change state each time a clock pulse is received. The second and remaining flip flops 40 are each clocked by the Q and $\overline{Q}$ of the preceding flip flop. In order to reduce the frequency of the 38.75 MHz oscillator to roughly 1 to 10 Hz, divider 32 includes a total of twenty-one flip flops with each flip flop dividing the input clock frequency by two.

Figure 5:
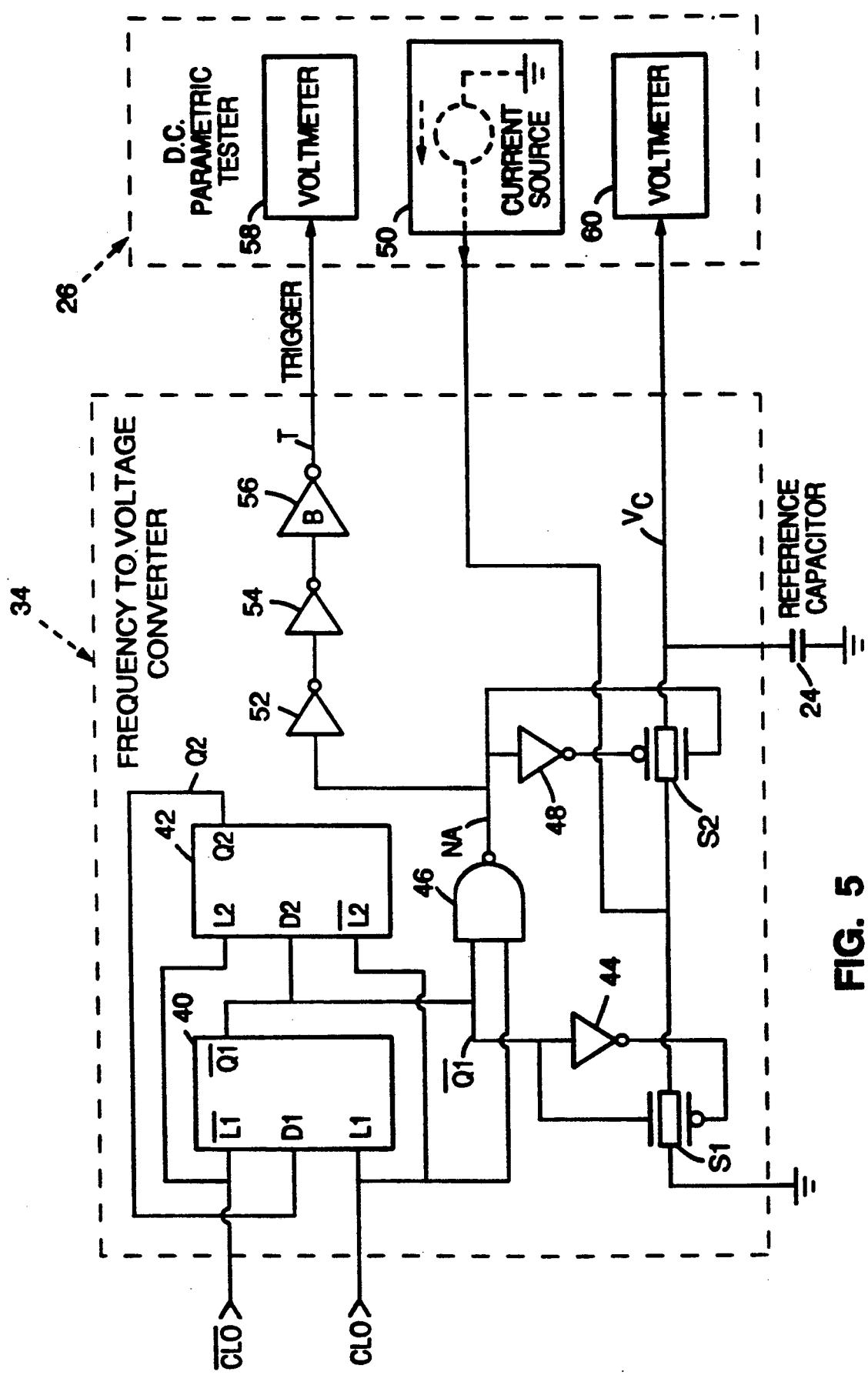
FIG. 5 is a detailed schematic diagram of the frequency-to-voltage converter portion of the FIG. 2 process monitor circuit.
Figure 6:
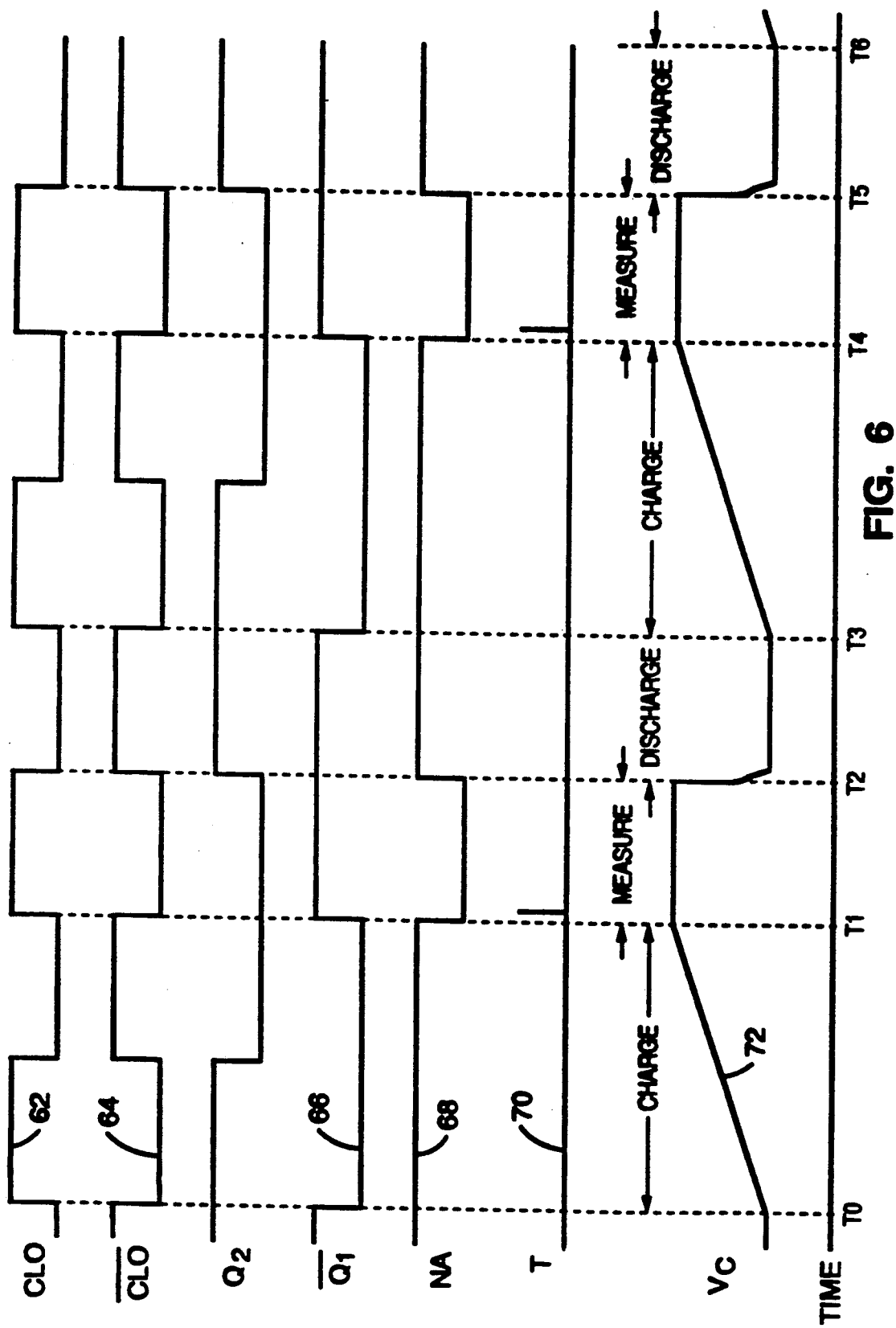
FIG. 6 depicts waveforms representing various signals generated by the FIG. 5 frequency-to-voltage converter.

The approximately 1 to 10 Hz signals CLO and $\overline{CLO}$ produced by divider 32 are coupled to frequency-to-voltage converter 34, the details of which are depicted in FIG. 5. Waveforms for various signals produced by converter 34 are shown in FIG. 6.

The objective of converter 34 is to produce a voltage Vc having a magnitude which is proportional to the period of clocks CLO and $\overline{CLO}$. This is accomplished by charging external reference capacitor 24 utilizing a constant current source located in a parametric tester 26 for one clock CLO (or $\overline{CLO}$) period. The resultant voltage Vc across the reference capacitor has a magnitude which is proportional to the output frequency of ring oscillator 30.

Converter 34 includes a pair of latches 40, 42 which produce timing signals for the converter. Latch 40 has a pair of clock inputs L1, L1 which receive clocks CLO and $\overline{CLO}$, respectively, and latch 42 has a pair of clock inputs L2 and L2 which receive clocks $\overline{CLO}$ and CLO, respectively. The true output Q2 of latch 42 is connected back to input D1 of latch 40 and the inverted output of Q1 of latch 40 is connected to input D2 of latch 42.

Output Q1 of latch 40 functions to control the state of switch S1, with S1 being a conventional transfer gate comprised of a P channel and an N channel MOS transistor connected in parallel. Signal Q1 is connected directly to one control input of switch S1 with the inverse of $\overline{Q}$ being connected to the second control input of switch S1 through an inverter 44. When Q1 is a logic "1", switch S1 is conductive, otherwise the switch is off.

The converter further includes a NAND gate 46, the two inputs of which are connected to latch 40 output of Q1 and clock CLO. The output of gate 46 is connected to one control input of a second transfer connected to one control input of a second transfer gate S2 and the inverted output is supplied tot he remaining control input through an inverter 48. Switch S1 is conductive when the output NA of gate 46 is a logic "1", otherwise the switch is off.

Switch S1 has one terminal connected to a circuit common by way of a wafer probe card (not shown) and the remaining terminal connected to one terminal of switch S2. The remaining terminal of switch S1 is also connected by way of the wafer probe card to a constant current source 50 located in the D.C. parametric tester 26. The remaining terminal of switch S2 is connected to the reference capacitor 24 by way of a probe card and to a D.C. voltmeter 60 located in the parametric tester 26.

Reference capacitor 24 is preferably mounted on the probe card, with the remaining terminal connected to circuit common. The output of gate 46 is also connected to a buffer circuit 56 through two inverter circuits 52 and 54. The output T of buffer circuit 56 forms a trigger signal received by a second D.C. voltmeter located in parametric tester 26 by way of the probe card.

Referring to FIG. 6, waveforms 62 and 64 depict clocks CLO and $\overline{CLO}$, respectively. As can be seen in FIG. 6, signals Q2 and Q1 have a frequency equal to one half that of clocks CLO, $\overline{CLO}$ and are shifted in phase with respect to one another. Just prior to time To, Q1 (waveform 66) is a logic "1", therefore switch S1 is conductive. Similarly, switch S2 is conductive since the output NA (waveform 68) of gate 46 is a logic "1". Accordingly, reference capacitor 24 is shorted to circuit common through switches S1 and S2 and the voltage Vc is zero as indicated by waveform 72. Switch S1 also functions to short the current produced by current source 50 to the current common.

At time To, signal Q1 goes high thereby turning switch S1 off, while switch S2 remains on. Thus, the constant current from the current source 50 in the parametric tester 26 is diverted to capacitor 24. As can be seen by waveform 72, the voltage Vc across capacitor 24 increases linearly with time.

At time T1 signal NA goes low (a logic "0") causing switch S2 to turn off thereby disconnecting the capacitor 24 from the remainder of the circuit. Signal NA also causes buffer 56 to produce a trigger signal T1, represented by waveform 70, which is delayed slightly by inverters 52 and 54. Signal T is detected by voltmeter 58 of the parametric tester 26. The parametric tester is configured so that voltmeter 58 will cause voltmeter 60 to sample voltage Vc upon receipt of the trigger. At time T2, switches S1 and S2 turn on again thereby discharging capacitor 24. This "charge", "measure" and "discharge" sequence is repeated between times T3 and T6 and every one and one-half cycles of signals CLO and $\overline{CLO}$ thereafter.

The sampled voltage Vc across capacitor 24 at the end of the charge period is directly proportional to the length of the charge period To-T1 (or T3-T4) which is equal to one cycle of signals CLO and $\overline{CLO}$. The period of signals CLO and $\overline{CLO}$ is directly related to the period of the ring oscillator 30 output (thus inversely related to the frequency) in accordance with the following equation:

$$P = \frac{Vc \times CR}{I \times 2^{NC}} \quad (2)$$

Where
P is the period of the ring oscillator 30 output;
Vc is the sampled voltage across reference capacitor 24 at the end of the charge period;
CR is the value of reference capacitor 24;
I is the magnitude of the current source 50 output; and
NC is the number of stages in the frequency divider 32.

In one test of the subject invention, a reference capacitor 24 was used having a value of 4.7 $\mu$F together with a D.C. parametric tester configured to provide a constant current of 200 $\mu$A. The frequency divider 32 was implemented with 21 number of stages (Nc) and the sampled voltage Vc was 2.30 volts. The period of the ring oscillator 30 output was calculated to be $25.30 \times 10-11$ nanoseconds in accordance with equation (2) which corresponds to a frequency of 38.80 MHz. The actual measured period of the oscillator 30 output was within approximately 3% of the calculated value.

As previously noted, the frequency of the ring oscillator 30 is a function of the propagation delay through each inverter 36. Such propagation delays are dependent upon both D.C. and A.C. parameters, as is well known. These parameters are, in turn, a function of the fabrication process utilized.

Figure 7:
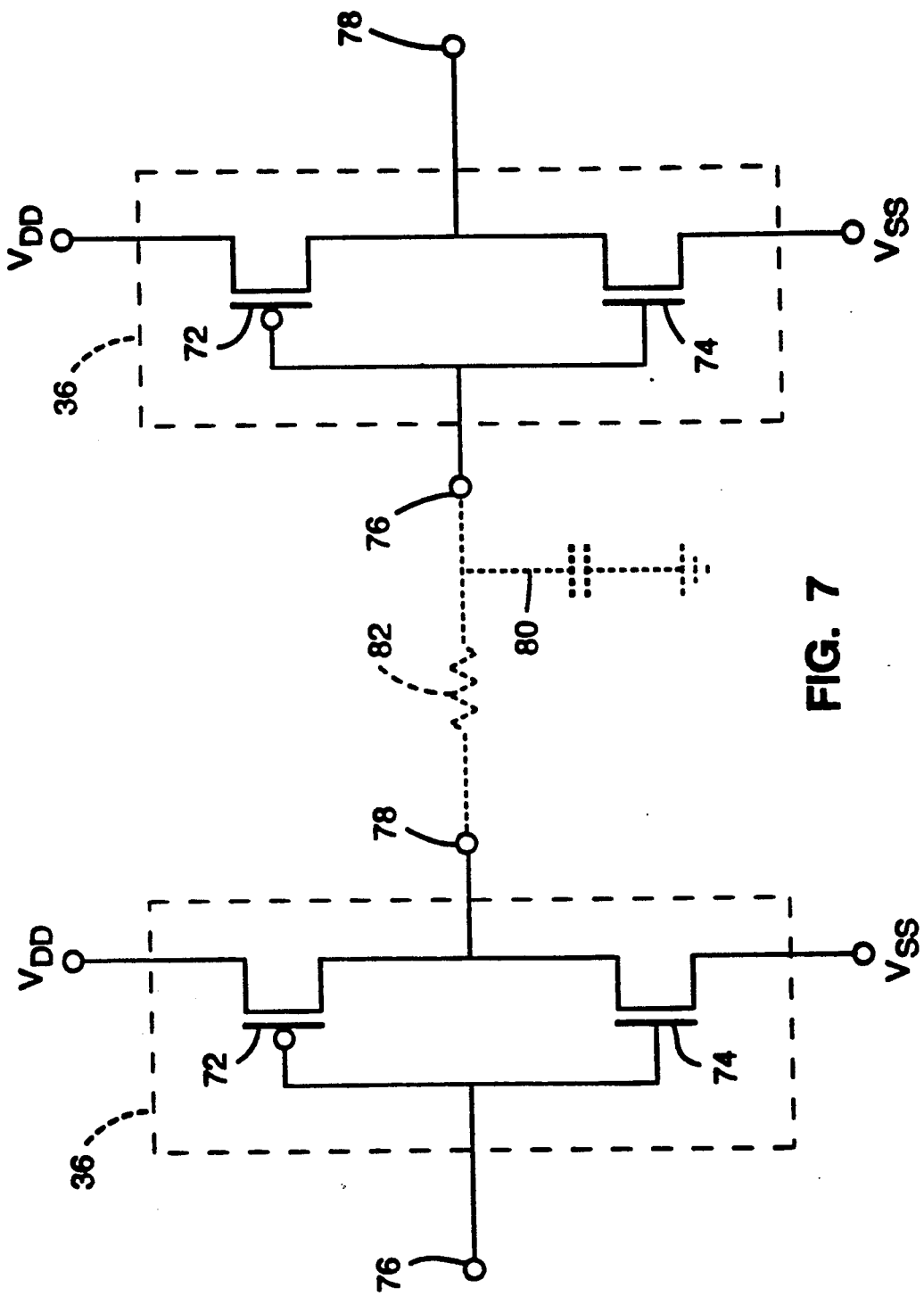
FIG. 7 is a detailed schematic diagram of two exemplary inverter stages which form the FIG. 3 ring oscillator.

FIG. 7 is a diagram showing further details of the construction of the individual inverters 36 which make up ring oscillator 30. In the present embodiment, the inverters are CMOS inverters which include a P channel pull up transistor 72 and an N channel pull down transistor 74. The gate electrodes of transistors 72 and 74 are tied together to form the input 76 of the inverters. The drain electrodes of the two transistors are tied together to form the inverter output 78 and the source electrodes of transistors 72 and 74 are connected to the positive supply VDD and circuit common VSS, respectively.

The inverters 36 include various capacitances including parasitic capacitances associated with transistors 72 and 74 and interconnection capacitances. Capacitor 80 is a lumped capacitance representing the total load capacitance at the output of the inverter. Capacitor 80 is roughly the sum of the diffusion capacitance of the drain regions of transistors 72 and 74 connected to the output 78 and the routing capacitances associated with the interconnect between the output of the driving inverter and the input of the driven inverter. Resistor 82 is a lumped resistance representing the resistance of the connection between two adjacent inverters.

In order for the output 78 of the inverter to change from a low voltage state to a high voltage state, it is necessary for transistor 72 to charge capacitors 80 through conductor 82. Similarly, in order for the inverter output to change from a high voltage state to a low voltage state, transistor 74 must discharge capacitor 80. The charge and discharge current magnitudes are dependent upon many factors, including the size and geometry of the transistors 72 and 74. The rate at which the output voltage can change is also a function of the RC time constant formed by resistor 82 and capacitor 80.

Inverter 36 can be fabricated in the conventional manner. Alternatively, the inverters can be made in a manner such that A.C. performance is more sensitive to process variations. For example, steps can be taken to artificially increase the value of capacitor 80 and resistance 82. In this manner, relatively small variations in a fabrication process will result in substantial changes in propagation delay and hence the output frequency of oscillator.

The test circuit 22 (FIG. 2) is especially useful in connection with the transfer of a fabrication process from one facility to another. Typically, a prototype integrated circuit device is developed at a development facility. The design and process are first optimized.

Wafers are then fabricated which include one or more process monitor die. The process monitor die 22 each include conventional test patterns for D.C. characterization and the test circuit 22 for A.C. characterization. The D.C. and A.C. characterization are utilized to develop process specifications, including both A.C. and D.C. specifications.

Once the process specifications has been developed, the process can be transferred to another facility such as a foundry. Devices are fabricated at the foundry and electrical tests are performed on the process monitor die while in wafer form using a conventional parametric tester. The current provided by the parametric tester 26 and the value of the reference capacitor 24 must also be specified. The electrical test results are then evaluated to determine whether the A.C. and D.C. process specifications generated at the development facility are met.

If the process specifications are not met, the foundry process can be immediately adjusted to correct for any deficiencies. Once the process has been adjusted, as required, additional integrated circuit devices can be fabricated utilizing the adjusted process. The additional integrated circuit devices may be the same as or different from the type that were originally fabricated after the transfer of the fabrication process.

As can be seen from the foregoing, it is not normally necessary to ship the fabricated wafers back to the development facility for assembly and final electrical tests to determine whether both A.C. and D.C. specifications are met. Assuming that the A.C. and D.C. specifications are met, there can be a high level of confidence that the process has been successfully transferred from the development facility to the foundry.

Thus a novel test circuit and method of measuring both A.C. and D.C. characteristics at wafer test level utilizing a conventional D.C. parametric tester have been disclosed. Although a preferred embodiment of the invention has been described in some detail, it is to be understood that various changes can be made without departing from the spirit and scope of the invention as defined by the appended claims.

We claim:

1. A wafer of semiconductor material comprising:
   (1) a multiplicity of integrated circuit devices; and
   (2) at least one process monitor circuit means in said wafer separate from said integrated circuit devices for producing a process monitor output signal indicative of the performance of said integrated circuit devices, said process monitor circuit means including
   (a) oscillator means for producing an oscillator output signal having a frequency which varies with said performance;
   (b) means for receiving the output of a current source;
   (c) means for receiving one terminal of an external reference capacitor;
   (d) switching means responsive to said oscillator output signal for charging said capacitor with current from said current source for a charge period which is a function of said oscillator output signal so as to produce said process monitor output signal across said reference capacitor at the end of said charge period.

2. The wafer of claim 1 wherein said process monitor circuit means includes frequency divider means for reducing the frequency of said oscillator output signal and for controlling said switching means.

3. The wafer of claim 2 wherein said oscillator means includes a ring oscillator comprised of a plurality of inverter circuits.

4. The wafer of claim 3 wherein said switching means is also a means for generating a trigger voltage at the end of said charge period to be used by an external voltmeter to sample said process monitor signal across said reference capacitor.

* * * * *